US007934135B2

(12) United States Patent
Gass et al.

(10) Patent No.: US 7,934,135 B2
(45) Date of Patent: Apr. 26, 2011

(54) PROVIDING PSEUDO-RANDOMIZED STATIC VALUES DURING LBIST TRANSITION TESTS

(75) Inventors: Robert Benjamin Gass, Pflugerville, TX (US); Phillip G. Williams, Leander, TX (US)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 12/195,641

(22) Filed: Aug. 21, 2008

(65) Prior Publication Data

US 2010/0050031 A1    Feb. 25, 2010

(51) Int. Cl.
*G01R 31/28* (2006.01)
(52) U.S. Cl. ........................ 714/733; 714/726
(58) Field of Classification Search .......... 714/726, 714/731, 732, 733
See application file for complete search history.

(56) References Cited

U.S. PATENT DOCUMENTS

| 6,021,514 | A | | 2/2000 | Koprowski | 714/733 |
| 6,070,261 | A | * | 5/2000 | Tamarapalli et al. | 714/733 |
| 6,148,425 | A | * | 11/2000 | Bhawmik et al. | 714/726 |
| 6,247,154 | B1 | * | 6/2001 | Bushnell et al. | 714/733 |
| 6,966,021 | B2 | * | 11/2005 | Rajski et al. | 714/726 |
| 7,296,249 | B2 | * | 11/2007 | Rinderknecht et al. | 716/4 |
| 7,308,634 | B2 | | 12/2007 | Kiryu | 714/733 |
| 7,644,333 | B2 | * | 1/2010 | Hill et al. | 714/732 |
| 2004/0230882 | A1 | | 11/2004 | Huott et al. | 714/733 |
| 2008/0052581 | A1 | | 2/2008 | Douskey | 714/733 |

* cited by examiner

*Primary Examiner* — James C Kerveros
(74) *Attorney, Agent, or Firm* — VanLeeuwen & VanLeeuwen; Diana R. Gerhardt

(57) ABSTRACT

An LBIST captures pseudo-random values from a pseudo-random pattern generator. Next, the LBIST stabilizes an untimed logic path by inputting the captured pseudo-random value into the untimed logic path. In turn, the LBIST tests one or more timed signal transitions that are dependent upon the stabilized untimed logic path.

17 Claims, 6 Drawing Sheets

US 7,934,135 B2

PROVIDING PSEUDO-RANDOMIZED STATIC VALUES DURING LBIST TRANSITION TESTS

BACKGROUND OF THE INVENTION

1. Technical Field

The present invention relates to capturing pseudo-random values for use during logic built-in self-test (LBIST) timed signal transition tests. More particularly, the present invention relates to overriding functionally static signals with captured pseudo-random values to better test timed paths through logic influenced by the static signals.

2. Description of the Related Art

Modern microprocessors are often designed with static non-timed signals that provide setup information during functional operation of the chip. Even though these signals are static during functional operation they may sensitize paths through timed logic. This makes it desirable to test both values of the non-timed signal during testing of timed circuits with Logic Built in Self Test (LBIST). The invention described herein pertains to enhancing LBIST such that it utilizes pseudo random signals that are static during the functional transition capture cycle of LBIST.

SUMMARY

An LBIST captures pseudo-random values from a pseudo-random pattern generator. Next, the LBIST stabilizes an untimed logic path by inputting the captured pseudo-random value into the untimed logic path. In turn, the LBIST tests one or more timed signal transitions that are dependent upon the stabilized untimed logic path.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings, wherein.

DETAILED DESCRIPTION

Certain specific details are set forth in the following description and figures to provide a thorough understanding of various embodiments of the invention. Certain well-known details often associated with computing and software technology are not set forth in the following disclosure, however, to avoid unnecessarily obscuring the various embodiments of the invention. Further, those of ordinary skill in the relevant art will understand that they can practice other embodiments of the invention without one or more of the details described below. Finally, while various methods are described with reference to steps and sequences in the following disclosure, the description as such is for providing a clear implementation of embodiments of the invention, and the steps and sequences of steps should not be taken as required to practice this invention. Instead, the following is intended to provide a detailed description of an example of the invention and should not be taken to be limiting of the invention itself. Rather, any number of variations may fall within the scope of the invention, which is defined by the claims that follow the description.

The following detailed description will generally follow the summary of the invention, as set forth above, further explaining and expanding the definitions of the various aspects and embodiments of the invention as necessary. To this end, this detailed description first sets forth a computing environment in FIG. 1 that is suitable to implement the software and/or hardware techniques associated with the invention. A networked environment is illustrated in FIG. 2 as an extension of the basic computing environment, to emphasize that modern computing techniques can be performed across multiple discrete devices.

Figure 1:
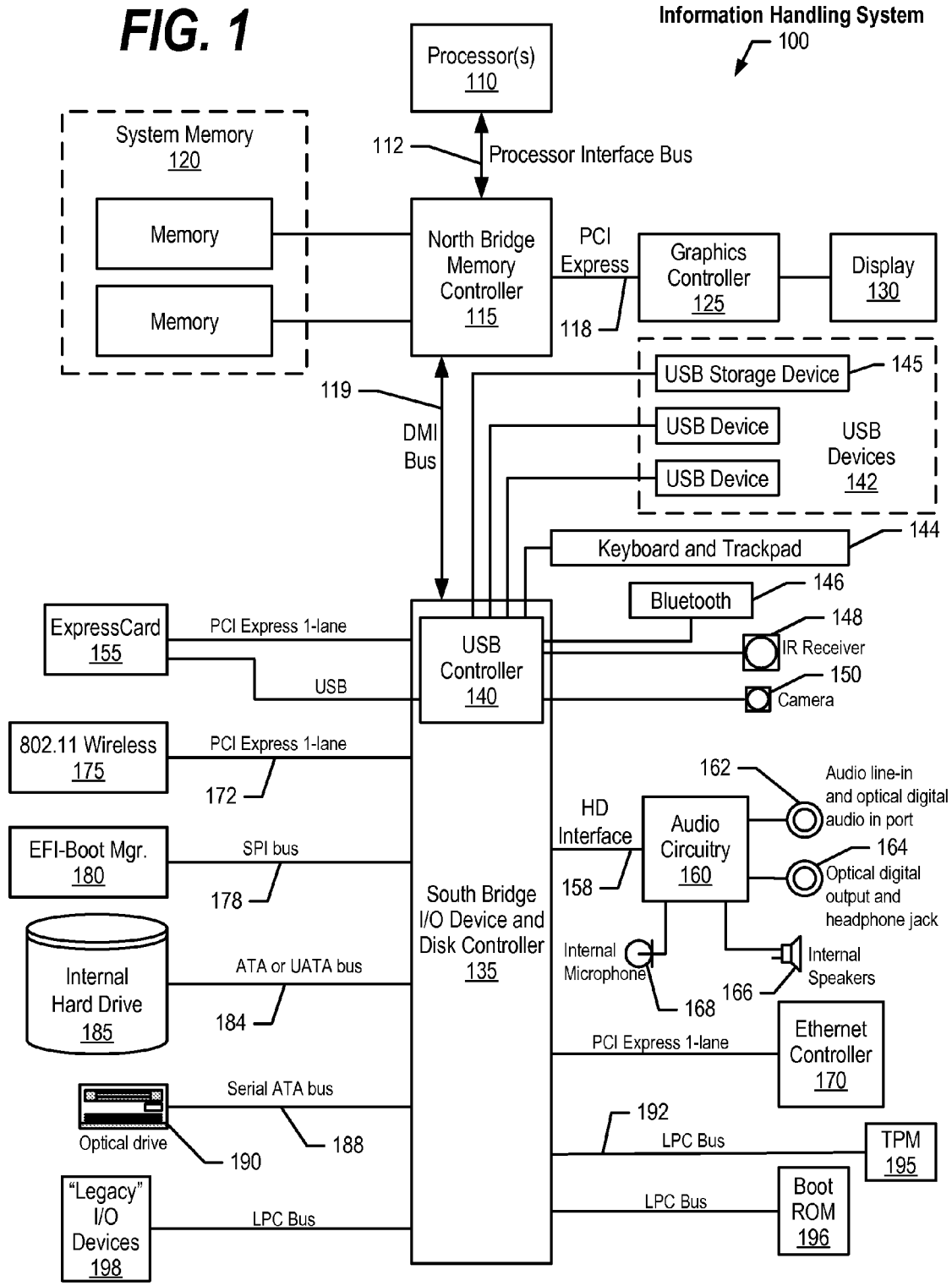
FIG. 1 is a block diagram of a data processing system in which the methods described herein can be implemented.
Figure 2:
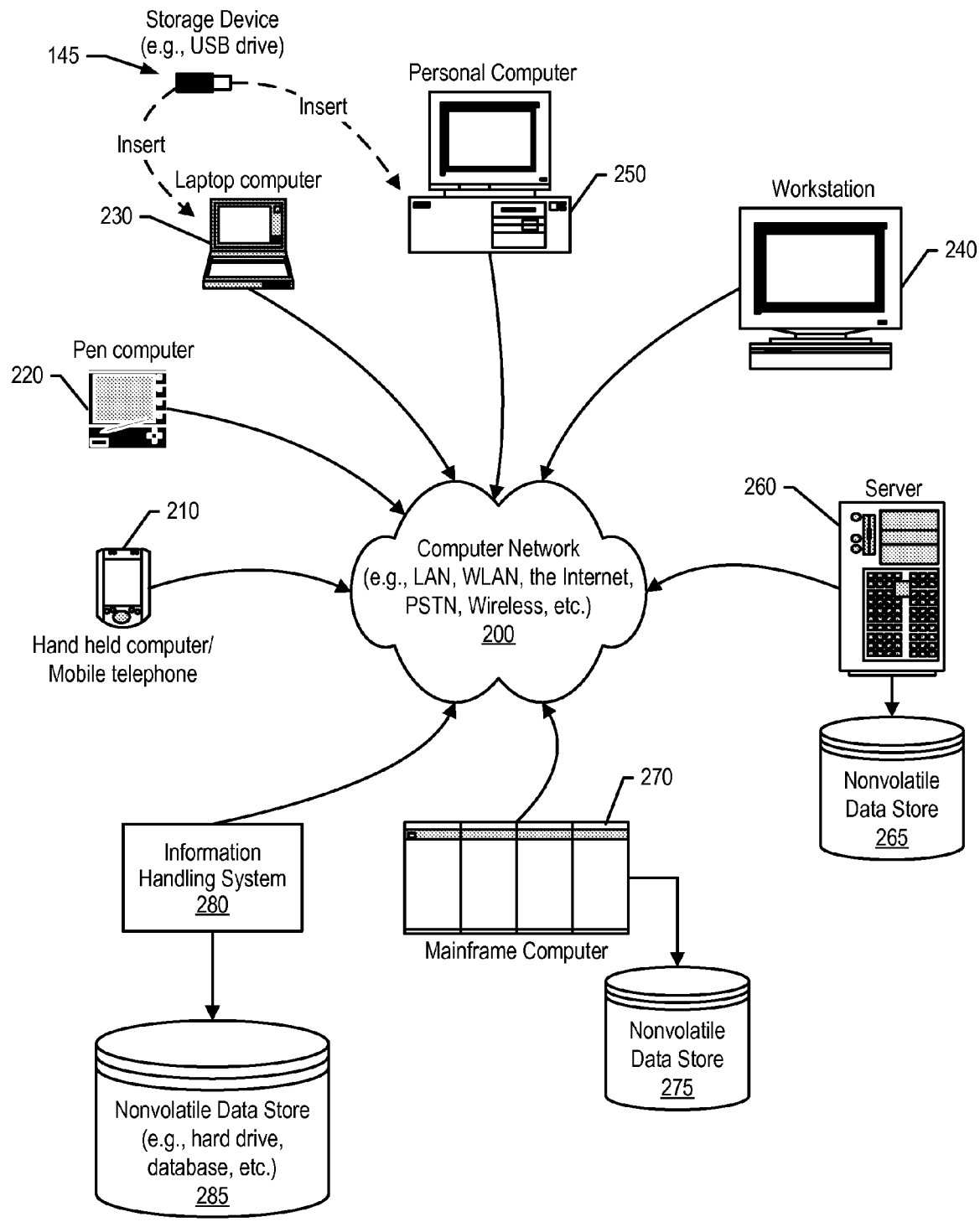
FIG. 2 provides an extension of the information handling system environment shown in FIG. 1 to illustrate that the methods described herein can be performed on a wide variety of information handling systems which operate in a networked environment.

FIG. 1 illustrates information handling system 100, which is a simplified example of a computer system capable of performing the computing operations described herein. Information handling system 100 includes one or more processors 110 coupled to processor interface bus 112. Processor interface bus 112 connects processors 110 to Northbridge 115, which is also known as the Memory Controller Hub (MCH). Northbridge 115 connects to system memory 120 and provides a means for processor(s) 110 to access the system memory. Graphics controller 125 also connects to Northbridge 115. In one embodiment, PCI Express bus 118 connects Northbridge 115 to graphics controller 125. Graphics controller 125 connects to display device 130, such as a computer monitor.

Northbridge 115 and Southbridge 135 connect to each other using bus 119. In one embodiment, the bus is a Direct Media Interface (DMI) bus that transfers data at high speeds in each direction between Northbridge 115 and Southbridge 135. In another embodiment, a Peripheral Component Interconnect (PCI) bus connects the Northbridge and the Southbridge. Southbridge 135, also known as the I/O Controller Hub (ICH) is a chip that generally implements capabilities that operate at slower speeds than the capabilities provided by the Northbridge. Southbridge 135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 196 and "legacy" I/O devices (using a "super I/O" chip). The "legacy" I/O devices (198) can include, for example, serial and parallel ports, keyboard, mouse, and/or a floppy disk controller. The LPC bus also connects Southbridge 135 to Trusted Platform Module (TPM) 195. Other components often included in Southbridge 135 include a Direct Memory Access (DMA) controller, a Programmable Interrupt Controller (PIC), and a storage device controller, which connects Southbridge 135 to nonvolatile storage device 185, such as a hard disk drive, using bus 184.

ExpressCard 155 is a slot that connects hot-pluggable devices to the information handling system. ExpressCard 155 supports both PCI Express and USB connectivity as it connects to Southbridge 135 using both the Universal Serial Bus (USB) the PCI Express bus. Southbridge 135 includes USB Controller 140 that provides USB connectivity to devices that connect to the USB. These devices include webcam (camera) 150, infrared (IR) receiver 148, keyboard and trackpad 144, and Bluetooth device 146, which provides for wireless personal area networks (PANs). USB Controller 140 also provides USB connectivity to other miscellaneous USB connected devices 142, such as a mouse, removable nonvolatile storage device 145, modems, network cards, ISDN connectors, fax, printers, USB hubs, and many other types of USB connected devices. While removable nonvolatile storage device 145 is shown as a USB-connected device, removable nonvolatile storage device 145 could be connected using a different interface, such as a Firewire interface, etcetera.

Wireless Local Area Network (LAN) device 175 connects to Southbridge 135 via the PCI or PCI Express bus 172. LAN device 175 typically implements one of the IEEE 802.11 standards of over-the-air modulation techniques that all use the same protocol to wireless communicate between information handling system 100 and another computer system or device. Optical storage device 190 connects to Southbridge 135 using Serial ATA (SATA) bus 188. Serial ATA adapters and devices communicate over a high-speed serial link. The Serial ATA bus also connects Southbridge 135 to other forms of storage devices, such as hard disk drives. Audio circuitry 160, such as a sound card, connects to Southbridge 135 via bus 158. Audio circuitry 160 also provides functionality such as audio line-in and optical digital audio in port 162, optical digital output and headphone jack 164, internal speakers 166, and internal microphone 168. Ethernet controller 170 connects to Southbridge 135 using a bus, such as the PCI or PCI Express bus. Ethernet controller 170 connects information handling system 100 to a computer network, such as a Local Area Network (LAN), the Internet, and other public and private computer networks.

While FIG. 1 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 195) shown in FIG. 1 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 2.

FIG. 2 provides an extension of the information handling system environment shown in FIG. 1 to illustrate that the methods described herein can be performed on a wide variety of information handling systems that operate in a networked environment. Types of information handling systems range from small handheld devices, such as handheld computer/mobile telephone 210 to large mainframe systems, such as mainframe computer 270. Examples of handheld computer 210 include personal digital assistants (PDAs), personal entertainment devices, such as MP3 players, portable televisions, and compact disc players. Other examples of information handling systems include pen, or tablet, computer 220, laptop, or notebook, computer 230, workstation 240, personal computer system 250, and server 260. Other types of information handling systems that are not individually shown in FIG. 2 are represented by information handling system 280. As shown, the various information handling systems can be networked together using computer network 200. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 2 depicts separate nonvolatile data stores (server 260 utilizes nonvolatile data store 265, mainframe computer 270 utilizes nonvolatile data store 275, and information handling system 280 utilizes nonvolatile data store 285). The nonvolatile data store can be a component that is external to the various information handling systems or can be internal to one of the information handling systems. In addition, removable nonvolatile storage device 145 can be shared among two or more information handling systems using various techniques, such as connecting the removable nonvolatile storage device 145 to a USB port or other connector of the information handling systems.

Figure 3:
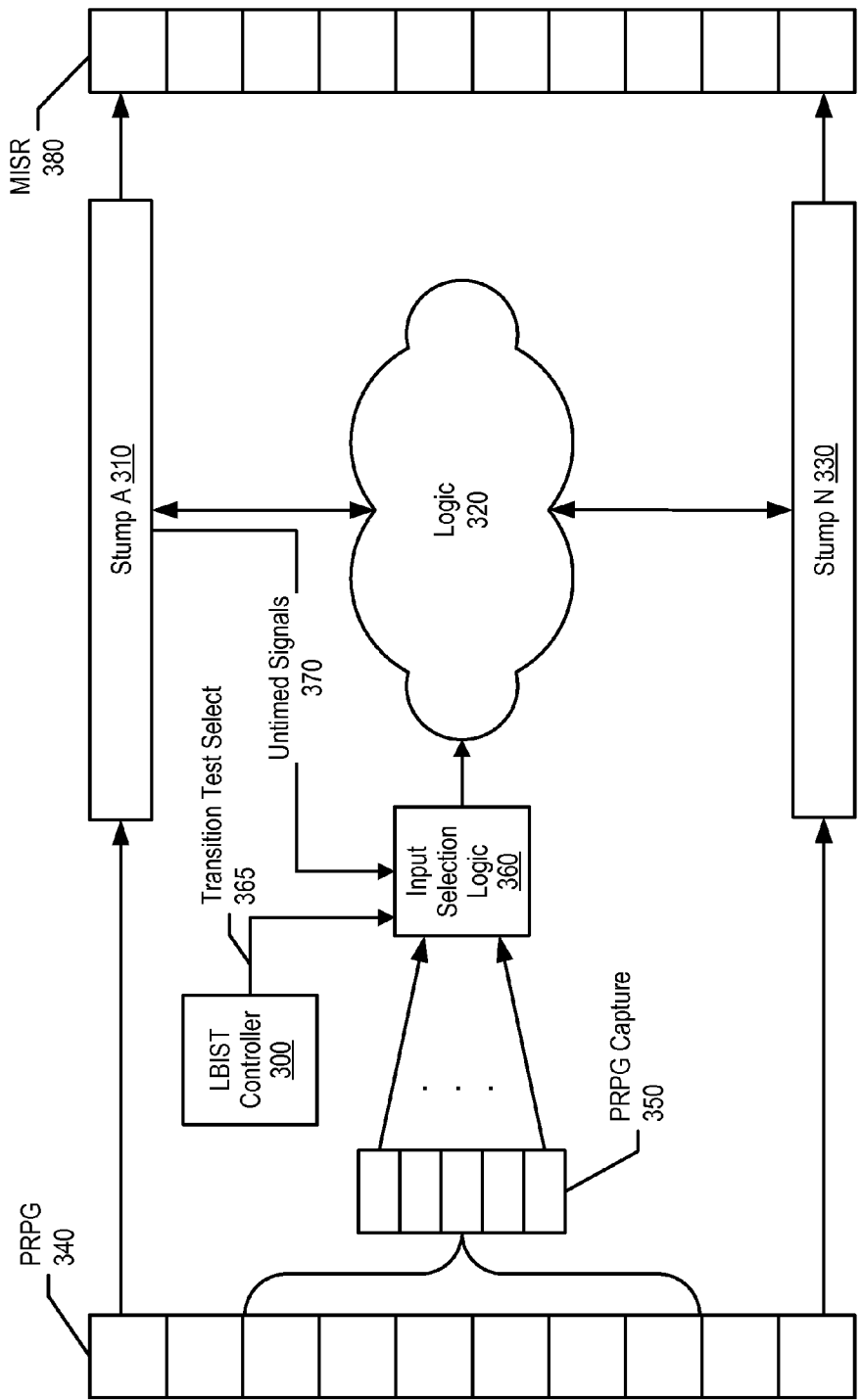
FIG. 3 is a diagram of a logic built-in self-test (LBIST) controller using captured pseudo-random values as inputs into untimed logic paths for testing timed signal transitions.

FIG. 3 is a diagram of a logic built-in self-test (LBIST) controller using captured pseudo-random values as inputs into untimed logic paths for testing timed signal transitions in order to verify logic functionality included in a device. The captured pseudo-random values allow the untimed logic paths to stabilize prior to LBIST functional transition capture operations, thus providing predictable results.

An LBIST process proceeds through a series of iterations to fully test a system. Each iteration includes a pseudo-random value capture operation, a scan operation, and a functional transition capture operation.

During the pseudo-random value capture operation, pseudo-random pattern generator (PRPG) capture register 350 "captures" values from in PRPG 340. LBIST controller 300 subsequently loads PRPG capture register 350 values into input selection logic 360. LBIST controller 300 activates transition test select 365 during LBIST timed signal transition testing periods, which instructs input selection logic 360 to use the captured pseudo-random values from PRPG capture register 350 as inputs into untimed logic paths included in logic 320. When transition test select 365 deactivates, input selection logic 360 uses untimed signals 370 as inputs into logic 320 for normal functional operation or static testing.

During the scan operation, PRPG 340 updates its pseudo-random values, and inputs the pseudo-random values into stumps A 310 through N 330. Each "stump" includes multiple latches having signals input into logic 320 and signals output from logic 320. Some of the signals are untimed signals, while other signals are timed signals (see FIG. 5 and corresponding text for further details). Also during the scan operation, LBIST controller 300 loads values from stump A 310 through N 330 into multiple-input signature register (MISR) 380 and compresses the values. Since LBIST controller 300 selects captured pseudo-random values as inputs prior to the scan operation, the untimed logic paths have time to stabilize during the scan operation and prior to the functional transition capture operation.

Once LBIST controller 300 completes the scan operation, the system is ready for the functional transition capture operation. The functional transition capture operation issues functional clocks to the system in order to test timed signal transitions, which are eventually rolled up into MISR 380. Since the captured pseudo-random values stabilize the untimed logic paths, the transition test results are predictable. After the function transition test operation, LBIST may repeat another iteration, thus beginning another pseudo-random value capture operation, until the LBIST is complete.

Figure 4:
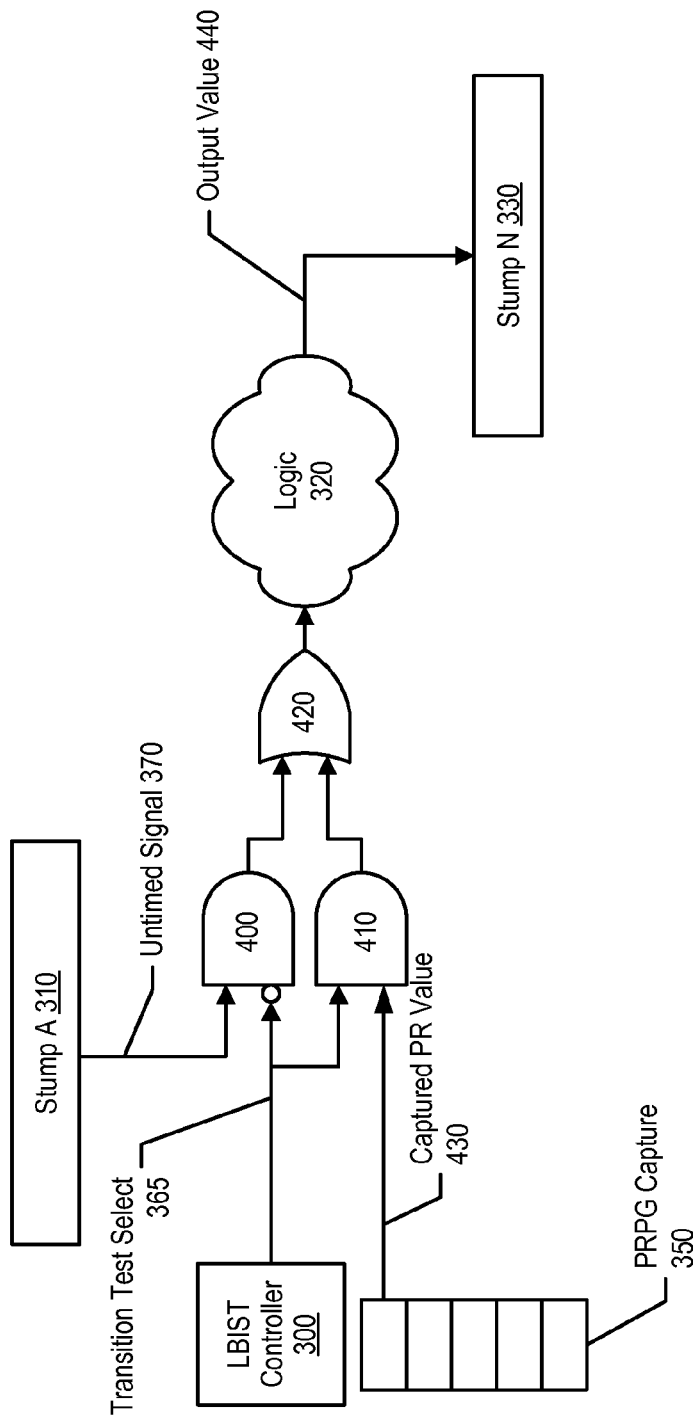
FIG. 4 is a diagram showing input selection logic that selects either a pseudo-random captured value during LBIST test or an untimed signal during functional operation or static testing.

FIG. 4 is a diagram showing input selection logic that selects either a pseudo-random captured value during LBIST test or an untimed signal during functional operation or static testing.

LBIST controller 300 activates transition test select 365 during LBIST timed signal transition testing periods, which activates gate 410 and inactivates gate 400. As such, captured pseudo-random value 430 received from PRPG capture 350 feeds through gates 410 and 420 into logic 320 as an input to an untimed logic path. In turn, logic 320's output value 440 feeds into one of the latches included in stump N 330.

When LBIST controller 300 inactivates transition test select 365, gate 410 inactivates and gate 400 activates. As such, untimed signal 370 received from one of the latches included in stump A 310 feeds through gates 400 and 420 into logic 320 as an input to an untimed logic path.

Figure 5:
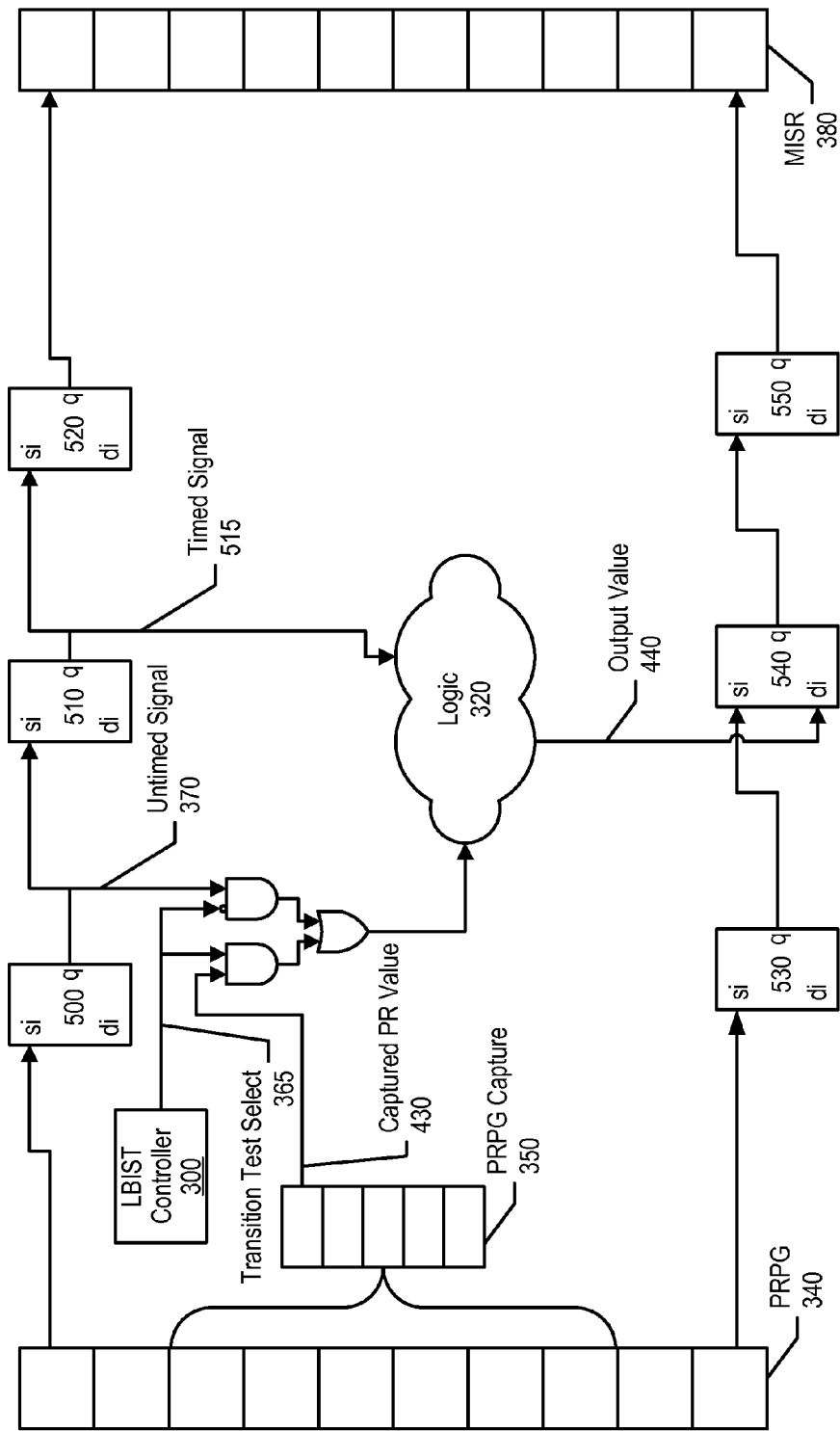
FIG. 5 is a detail diagram showing an LBIST controller selecting a pseudo-random captured value as an input into an untimed logic path during timed signal transition testing.

FIG. 5 is a detail diagram showing an LBIST controller selecting a pseudo-random captured value as an input into an untimed logic path during timed signal transition testing. The example shown in FIG. 5 includes latches 510 through 550. Latches 500 through 520 are included in stump A 310 shown in FIGS. 3-4, and latches 530-550 are included in stump N 330 shown in FIGS. 3-4. As those skilled in the art can appreciate, a stump may include more or less latches than what is shown in FIG. 5.

During a pseudo-random value capture operation, pseudo-random pattern generator (PRPG) capture register 350 "captures" values included in PRPG 340. The example shown in FIG. 5 shows that one of the values (captured pseudo-random value 430) feeds into one of the input selection logic AND gates. LBIST controller 300 activates transition test select 365 to feed captured pseudo-random value 430 into logic 320 during LBIST transition testing periods. Logic 320 also receives timed signal 515 from gate 510, which propagates through logic 320. In turn, logic 320's output value 440 feeds into latch 540's "data in" port, which is clocked through during the functional transition capture operation. During non-LBIST timed signal transition testing periods, LBIST controller 300 deactivates transition test signal 365, which allows untimed signal 370 to feed into logic 320 for normal functional operation or static testing.

Figure 6:
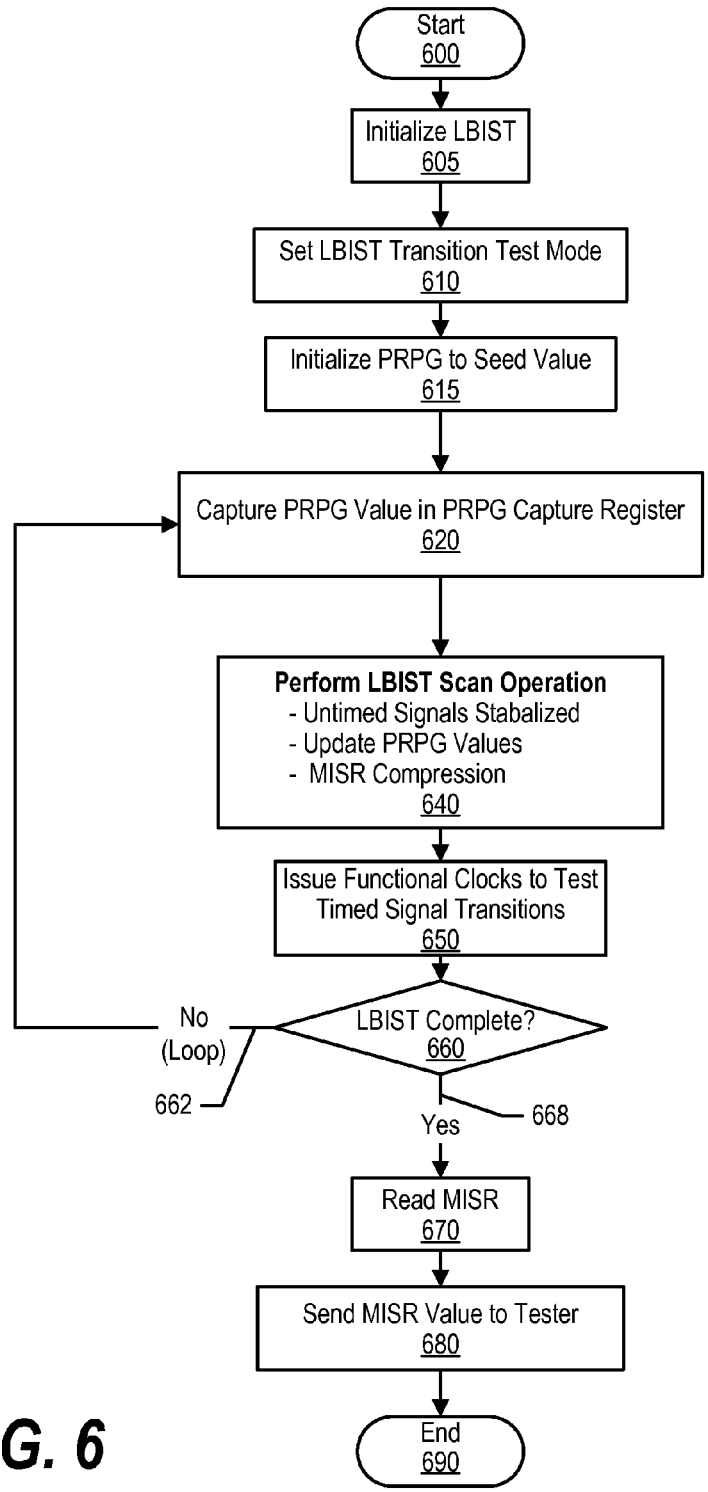
FIG. 6 is a flowchart showing steps taken in capturing pseudo-random values and utilizing the captured pseudo-random values during timed signal transition testing.

FIG. 6 is a flowchart showing steps taken in capturing pseudo-random values and utilizing the captured pseudo-random values during timed signal transition testing.

Processing commences at 600, whereupon a device tester initializes a device's logic built-in self-test (LBIST). At step 610, an LBIST controller sets an LBIST transition test mode by setting an LBIST transition test signal. The LBIST controller, at step 620, initializes a pseudo-random pattern generator (PRPG) to a particular seed value. Once the PRPG is initialized, the LBIST controller captures a subset of the PRPG in a set of PRPG capture registers. The amount of pseudo-random values depends upon the amount of values needed to input into untimed logic paths. For example, if there are three hundred untimed logic paths, the set of PRPG capture registers may be three hundred registers wide.

The LBIST controller, at step 640, performs an LBIST scan operation that: 1) allows the untimed logic paths to stabilize with the captured pseudo-random values as their inputs; 2) updates the PRPG values; and 3) performs a compression on values included in a multiple-input signature register (MISR).

Once the scan operation completes and, therefore, the untimed signals are stabilized, the LBIST controller issues functional clocks to the logic under test in order to test timed signal transitions (step 650). A determination is made as to whether the LBIST is complete (decision 660). For example, the LBIST may proceed through three thousands iterations (steps 620-650) before completing. If LBIST is not complete, decision 660 branches to "No" branch 662, which loops back to perform another LBIST iteration. This looping continues until the LBIST is complete, at which point decision 660 branches to "Yes" branch 668 whereupon the LBIST controller reads the final MISR value (step 670) and provides the value to a tester in order for the tester to determine whether the LBIST passed or failed (step 680). LBIST controller processing steps end at 690.

An implementation of the invention is a client application, namely, a set of instructions (program code) or other functional descriptive material in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive). Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps. Functional descriptive material is information that imparts functionality to a machine. Functional descriptive material includes, but is not limited to, computer programs, instructions, rules, facts, definitions of computable functions, objects, and data structures.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer-implemented method for testing one or more timed signal transitions within a device during a logic built-in self-test, the method comprising:
    generating a pseudo-random value using a pseudo-random pattern generator included in the device;
    storing a portion of the pseudo-random value into a capture register included in the device, the stored portion of the pseudo-random value being a captured pseudo-random value;
    invoking a transition test select signal from a logic built-in self-test controller, the logic built-in self-test controller controlling the logic built-in self test;
    in response to invoking the transition test select signal, loading the captured pseudo-random value from the capture register into an untimed logic path, wherein the loading results in stabilizing the untimed logic path to a static state;
    in response to the untimed logic path stabilizing to a static state, issuing a functional clock; and
    testing one or more timed signals that transition state according to the issued functional clock, wherein the one or more timed signals are dependent upon the stabilized untimed logic path.

2. The method of claim 1 further comprising:
    updating, by the pseudo-random pattern generator, the pseudo-random pattern generator registers during a scan operation; and
    compressing a multiple-input signature register value included in the device during the scan operation, the multiple-input signature register including one or more values received from one or more stump of latches that are included in the timed signal transition testing.

3. The method of claim 2 further comprising:
    determining that the logic built-in self test is complete; and
    in response to the determination, providing the compressed multiple-input signature register value to a tester that is external to the device.

4. The method of claim 1 wherein the pseudo-random pattern generator includes a plurality of pseudo-random pattern generator registers, the method further comprising:
    initializing the pseudo-random pattern generator registers with a seed value;
    capturing a subset of the pseudo-random pattern generator registers, wherein the subset includes a plurality of captured pseudo-random values that includes the captured pseudo-random value; and
    loading each one of the plurality of captured pseudo-random values into a plurality of untimed logic paths that includes the untimed logic path.

5. The method of claim 1 wherein the captured pseudo-random value overrides an untimed signal that loads into the untimed logic path during functional operation.

6. The method of claim 1 wherein the loading of the captured pseudo-random value into the untimed logic path ensures a predictable result of the testing.

7. A system comprising:
    one or more processors;
    a logic built-in self-test controller included in the processor that performs actions of:
        invoking a pseudo-random pattern generator to generate a pseudo-random value;
        storing a portion of the pseudo-random value into a capture register included in one of the processors, the stored portion of the pseudo-random value being a captured pseudo-random value;
        invoking a transition test select signal to load the captured pseudo-random value from the capture register into an untimed logic path, wherein the loading results in stabilizing the untimed logic path to a static state;
        in response to the untimed logic path stabilizing to a static state, issuing a functional clock; and
        testing one or more timed signals that transition state according to the issued functional clock, wherein the one or more timed signals are dependent upon the stabilized untimed logic path.

8. The system of claim 7 wherein the logic built-in self-test controller performs actions of:
    updating, by the pseudo-random pattern generator, the pseudo-random pattern generator registers during a scan operation; and
    compressing a multiple-input signature register value included in the device during the scan operation, the multiple-input signature register including one or more values received from one or more stump of latches that are included in the timed signal transition testing.

9. The system of claim 8 wherein the logic built-in self-test controller performs actions of:
    determining that the logic built-in self test is complete; and
    in response to the determination, providing the compressed multiple-input signature register value to a tester that is external to the device.

10. The system of claim 7 wherein the pseudo-random pattern generator includes a plurality of pseudo-random pattern generator registers, the logic built-in self-test controller performing further actions of:
    initializing the pseudo-random pattern generator registers with a seed value;
    capturing a subset of the pseudo-random pattern generator registers, wherein the subset includes a plurality of captured pseudo-random values that includes the captured pseudo-random value; and
    loading each one of the plurality of captured pseudo-random values into a plurality of untimed logic paths that includes the untimed logic path.

11. The system of claim 7 wherein the captured pseudo-random value overrides an untimed signal that loads into the untimed logic path during functional operation.

12. A computer program product stored in a computer readable medium, comprising functional descriptive material that, when executed by an information handling system, causes the information handling system to perform actions that include:
    generating a pseudo-random value using a pseudo-random pattern generator included in the device;
    storing a portion of the pseudo-random value into a capture register included in the device, the stored portion of the pseudo-random value being a captured pseudo-random value;
    invoking a transition test select signal from a logic built-in self-test controller, the logic built-in self-test controller controlling the logic built-in self test;
    in response to invoking the transition test select signal, loading the captured pseudo-random value from the capture register into an untimed logic path, wherein the loading results in stabilizing the untimed logic path to a static state;
    in response to the untimed logic path stabilizing to a static state, issuing a functional clock; and testing one or more timed signals that transition state according to the issued functional clock, wherein the one or more timed signals are dependent upon the stabilized untimed logic path.

13. The computer program product of claim 12 wherein the information handling system further performs actions that include:
   updating, by the pseudo-random pattern generator, the pseudo-random pattern generator registers during a scan operation; and
   compressing a multiple-input signature register value included in the device during the scan operation, the multiple-input signature register including one or more values received from one or more stump of latches that are included in the timed signal transition testing.

14. The computer program product of claim 13 wherein the information handling system further performs actions that include:
   determining that the logic built-in self test is complete; and
   in response to the determination, providing the compressed multiple-input signature register value to a tester that is external to the device.

15. The computer program product of claim 12 wherein the pseudo-random pattern generator includes a plurality of pseudo-random pattern generator registers, the information handling system further performing actions that include:
   initializing the pseudo-random pattern generator registers with a seed value;
   capturing a subset of the pseudo-random pattern generator registers, wherein the subset includes a plurality of captured pseudo-random values that includes the captured pseudo-random value; and
   loading each one of the plurality of captured pseudo-random values into a plurality of untimed logic paths that includes the untimed logic path.

16. The computer program product of claim 12 wherein the captured pseudo-random value overrides an untimed signal that loads into the untimed logic path during functional operation.

17. The computer program product of claim 12 wherein the loading of the captured pseudo-random value into the untimed logic path ensures a predictable result of the testing.

\* \* \* \* \*